Figure 1:
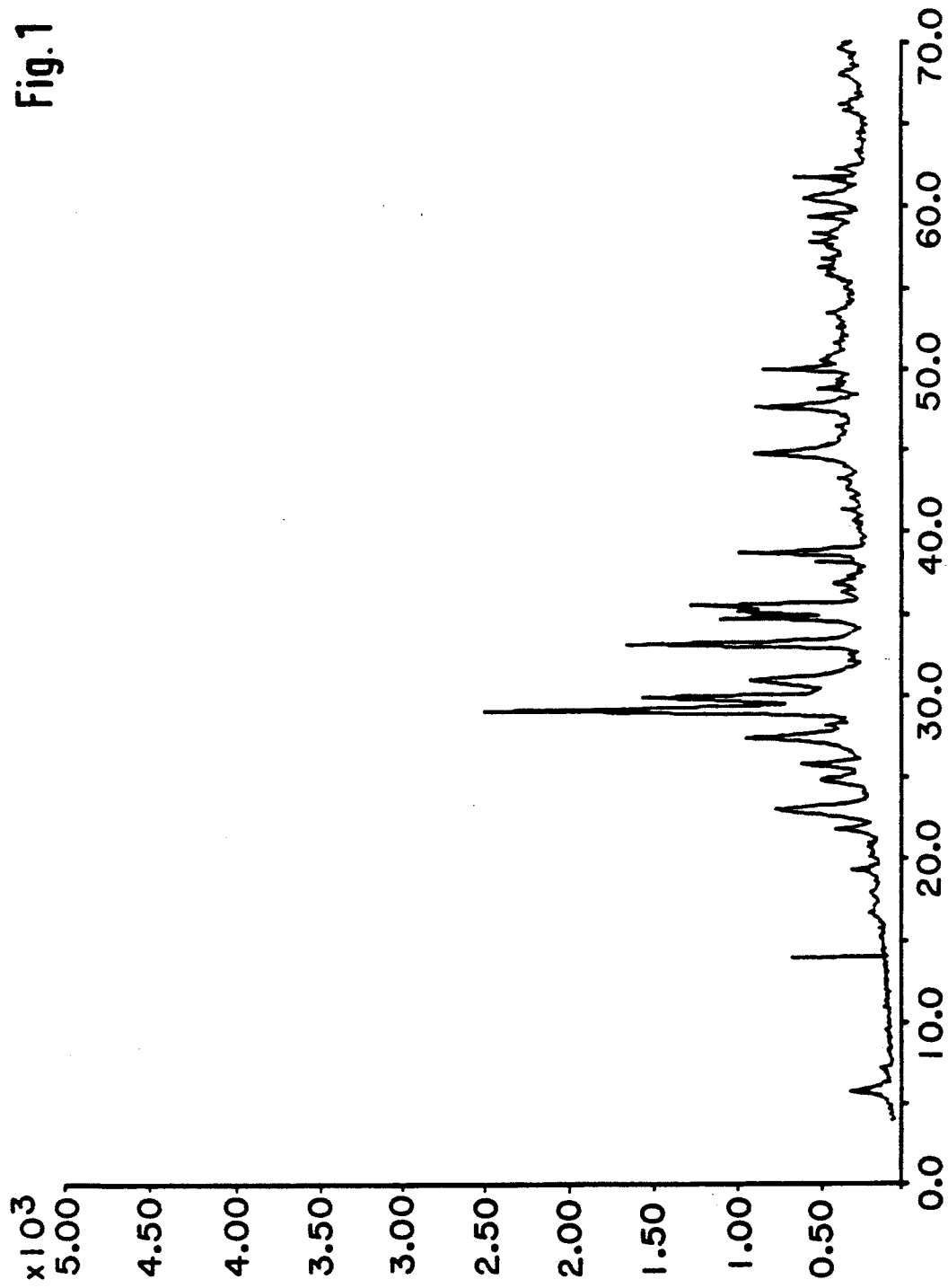
Figure 2:
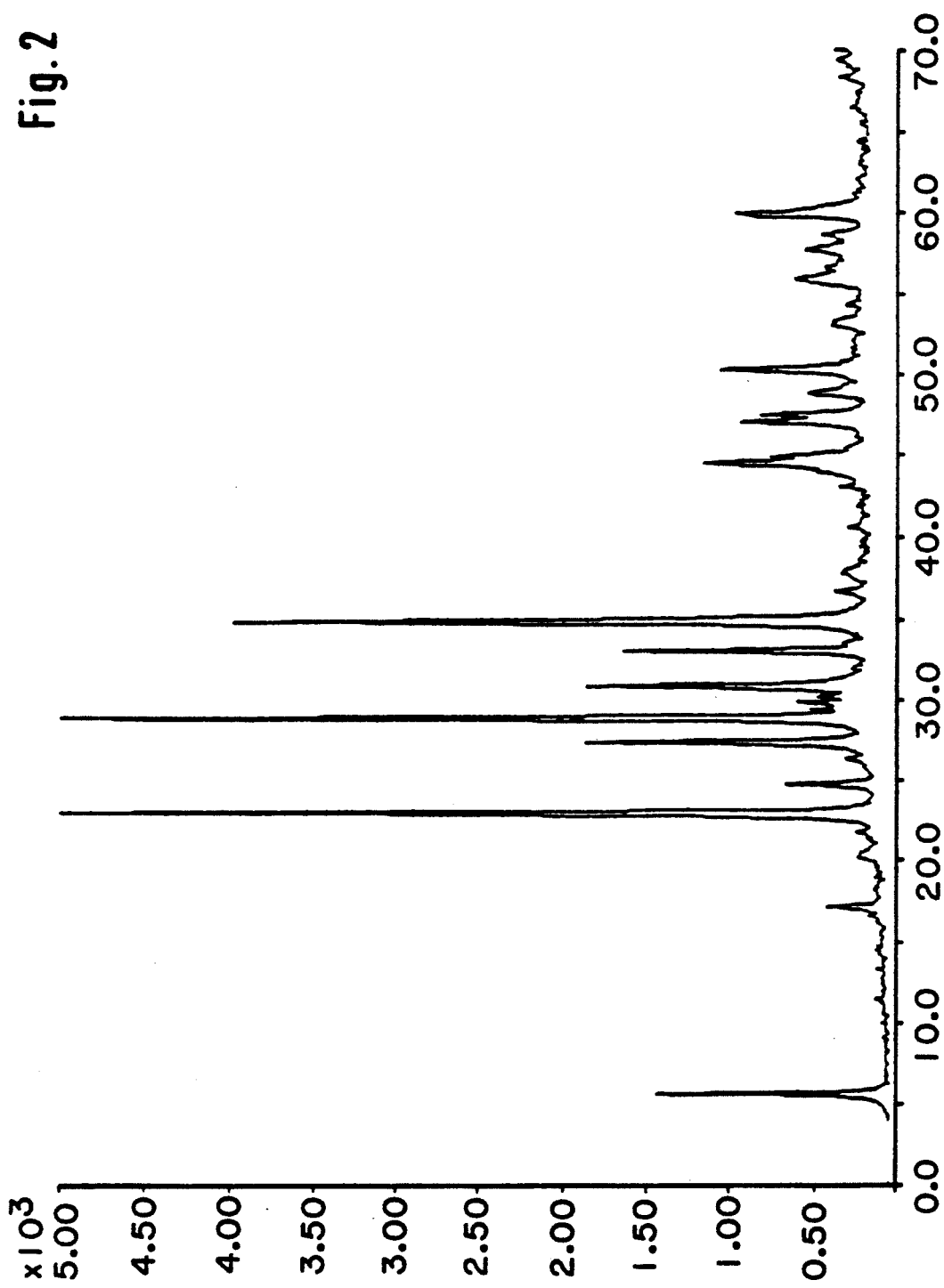
Figure 3:
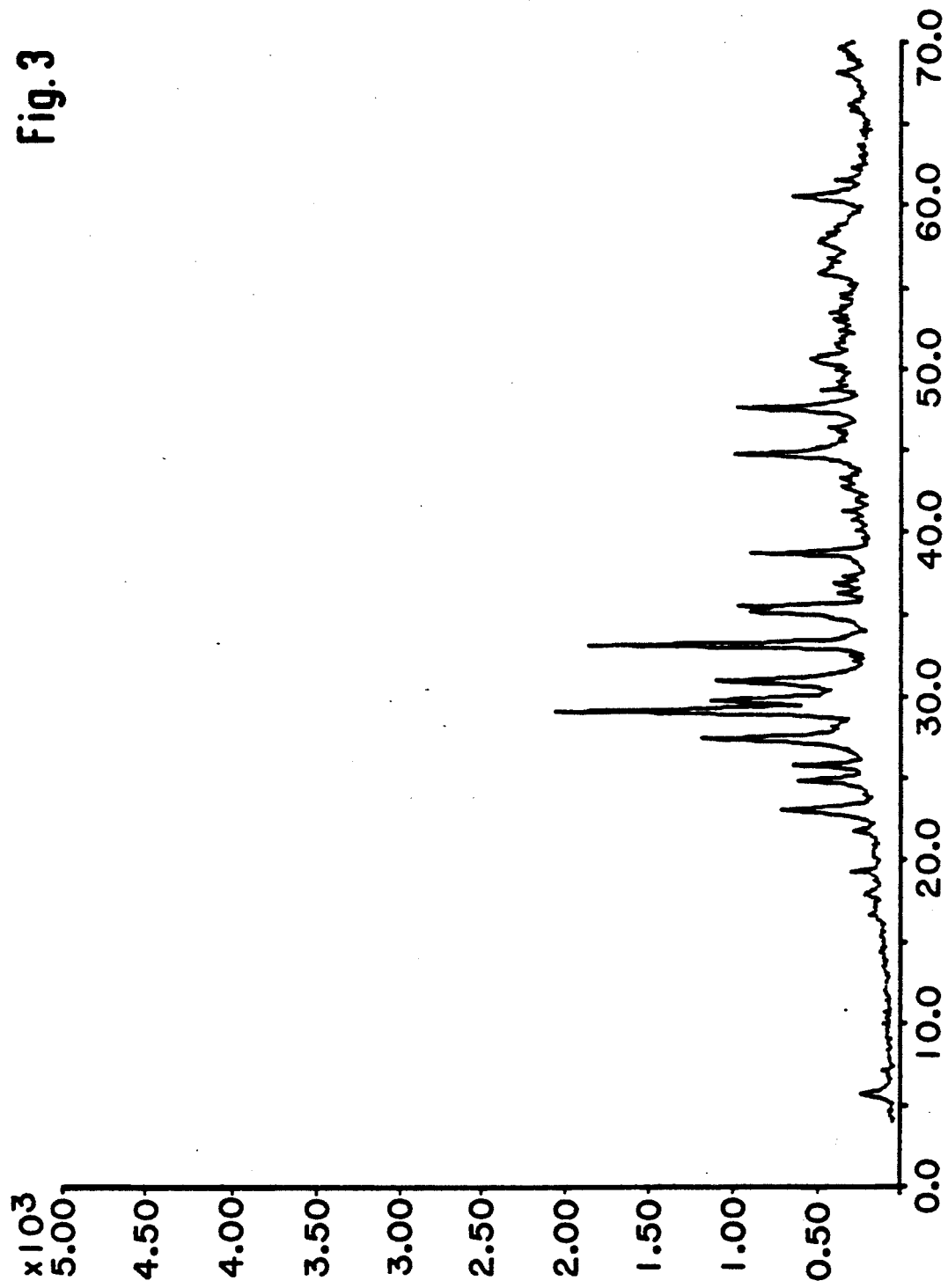

United States Patent [19]

Bock et al.

[11] Patent Number: 5,162,300
[45] Date of Patent: Nov. 10, 1992

[54] PROCESS FOR PRODUCING A HIGH-TEMPERATURE SUPERCONDUCTOR

[75] Inventors: Joachim Bock; Eberhard Preisler, both of Erftstadt, Fed. Rep. of Germany

[73] Assignee: Hoechst Aktiengesellschaft, Frankfurt am Main, Fed. Rep. of Germany

[21] Appl. No.: 676,784

[22] Filed: Mar. 28, 1991

[30] Foreign Application Priority Data

Apr. 11, 1990 [DE] Fed. Rep. of Germany ....... 4011725

[51] Int. Cl.$^5$ .................... C04B 35/50; C04B 35/64; H01B 12/00
[52] U.S. Cl. .......................... 505/1; 505/782; 501/123; 501/126; 252/521; 423/529; 423/635
[58] Field of Search .................... 505/1, 782; 252/521; 501/123, 126; 423/529, 635

[56] References Cited

FOREIGN PATENT DOCUMENTS 3707615 9/1988 Fed. Rep. of Germany.
3830092 3/1990 Fed. Rep. of Germany.
0313328 12/1989 Japan .................................. 505/782

OTHER PUBLICATIONS

Kato et al., "Superconductivity of Bismuth Strontium Calcium Copper Oxides Prepared from Cupric and Cuprous Oxide and Doped with Silver Ions", MRS Symp. Proc. 169, pp. 337–340, 1990.
World Patent Index Latest, 89-096338, Derwent, London 1989.

Primary Examiner—William R. Dixon, Jr.
Assistant Examiner—C. Melissa Bonner
Attorney, Agent, or Firm—Connolly & Hutz

[57] ABSTRACT

To produce a high-temperature superconductor of the composition $Bi_{(2+a)}(Sr_{(1-b)}Ca_b)_{(3-a)}Cu_{(2+c)}O_{(8+x)}$, where a is from 0 to 0.3, b is from 0.1 to 0.9 and c is from 0 to 2, and x has a value which depends on the oxidation state of the metals contained, oxides and/or carbonates of bismuth, strontium, calcium and copper are thoroughly mixed. In this process, the copper compound is used as a mixture of copper(I) oxide and copper(II) oxide. Then the mixture of oxides and/or carbonates is first allowed to react mutually in an inert gas atmosphere at temperatures from 700° to 800° C. for 0.5 to 36 hours before subsequently treating the mixture in an oxygen-containing atmosphere at temperatures from 700° to 875° C. for 3 to 60 hours.

8 Claims, 4 Drawing Sheets

PROCESS FOR PRODUCING A HIGH-TEMPERATURE SUPERCONDUCTOR

The present invention relates to a process for producing high-temperature superconductor of the composition $Bi_{(2+a)}(Sr_{1-b}Ca_b)_{(3-a)}CU_{(2+c)}O_{(8+x)}$, where a is from 0 to 0.3, b is from 0.1 to 0.9 and c is from 0 to 2, and x has a value which depends on the oxidation state of the metals contained, by thoroughly mixing the oxides and/or carbonates of bismuth, strontium, calcium and copper and heating this mixture.

In general, ceramic high-temperature superconductors are produced by solid-state reaction of mixtures of metal oxides or carbonates of the oxide systems Y-Ba-Cu-O, Bi-Sr-Ca-Cu-O or Tl-Ba-Ca-Cu-O. For this purpose, the mixtures are repeatedly annealed or sintered just below their melting point in air, the mixture being homogenized by grinding between each of the individual annealings or sinterings. In the Bi-Sr-Ca-Cu-O system, however, the so-called two-layer compound $Bi_2(SrCa)_3Cu_2O_{8+x}$ cannot be produced in a phase-pure state in this manner; CuO excess in the mixture of metal oxides or carbonates also does not yield a phase-pure compound.

German Offenlegungsschrift 3,830,092 discloses a process for producing a high-temperature superconductor of the composition $Bi_2(Sr,Ca)_3Cu_2O_x$ having values of 8 to 10 for x. In this process, stoichiometric mixtures of the oxides or carbonates of bismuth, strontium, calcium and copper are heated to temperatures of 870° to 1,100° C. with the formation of a homogeneous melt which has an oxygen deficiency. This melt is poured into molds and solidifie in them. The castings removed from the molds are heat treated for 6 to 30 hours at 780° to 850° C. and then treated in an oxygen atmosphere for not less than 6 hours at 600° to 830° C. to eliminate the oxygen deficiency. In this way, platelets having edge lengths or diameters of up to several cm and also rods up to 50 cm in length and 10 mm in diameter can be produced which always consist of the phase-pure compound.

For certain applications, superconducting material in the form of powders is required. The object of the present invention is therefore to provide a process which makes it possible to produce powdered high-temperature superconductors from mixtures of the oxides or carbonates of bismuth, strontium, calcium and copper directly and in as phase-pure a form as possible. According to the invention this is achieved by a process which comprises using the copper compound as a mixture of copper(I) oxide and copper(II) oxide, allowing the mixture first to react mutually in an inert gas atmosphere at temperatures from 700° to 800° C. for 0.5 to 36 hours, and then treating the mixture in an oxygen-containing atmosphere at temperatures from 700° to 875° C. for 3 to 60 hours.

The process according to the invention may, furthermore, optionally also be developed in that
a) the weight ratio of copper in the copper(I) oxide to copper in the copper(II) oxide is (0.25:1.75) to (1.75:0.25), preferably (0.5:1.5) to (1.5:0.5);
b) the mixture is allowed to react mutually in an inert gas atmosphere at temperatures from 750° to 780° C.;
c) the mixture is allowed to react mutually in an inert gas atmosphere for 12 to 24 hours;
d) argon and/or nitrogen is used as the inert gas;
e) treatment is carried out at in an oxygen-containing atmosphere temperatures from 810° to 860° C.;
f) air is used as the oxygen-containing atmosphere.

In the process according to the invention, an oxygen deficiency at the beginning of the reaction of the mixture of the oxides or carbonates is obviously of crucial importance for a rapid and complete total reaction.

In the process according to the invention, the desired superconducting phase is preformed by the reaction between the copper(I) oxide and the further metal components at 700° to 800° C, while in the subsequent treatment in an oxygen-containing atmosphere, the reaction is completed and the oxygen content of the compound necessary to obtain the superconducting phase is established. In this process it is advantageous if the temperature of the treatment in an oxygen-containing atmosphere is higher than in the case of the reaction in an inert gas atmosphere.

In the process according to the invention, the oxygen-containing atmosphere may have a higher oxygen partial pressure than air; it may, for example, be composed of pure oxygen. In the last-mentioned case, however, care has to be taken that the compounds are not excessively oxidized, i.e. do not have too high an oxygen index, since this results in a degradation of their superconducting properties.

In the process according to the invention, it is crucial that the first part of the reaction of the mixture of the oxides or carbonates is carried out under an inert gas atmosphere because, at the temperatures under consideration, $Cu_2O$ is unstable in the presence of oxygen in relation to the conversion to CuO and is therefore particularly reactive.

In the process according to the invention, the increased reactivity of $Cu_2O$ is exploited by the inert gas atmosphere during the first part of the reaction to form the two-layer compound and the competitive reaction to form CuO which proceeds in parallel in the presence of oxygen is prevented.

In the process according to the invention, the formation of the superconducting phase only proceeds at a sufficient rate if a mixture of copper(I) oxide and copper(II) oxide is used which contains not less than 12.5% by weight of copper as copper(II) oxide.

$Cu_{K\alpha}$ radiation was used to produce the radiograms whose diagrams are shown in FIGS. 1 to 4. In the X-ray diagrams to which reference is made in the following examples, the diffraction angle $2\theta$ is always plotted on the horizontal axis while the values on the vertical axis show the intensity.

EXAMPLE 1

(comparison)

A thoroughly homogenized mixture of $Bi_2O_3$, SrO, CaO and CuO in a stoichiometric ratio of 2:2:1:2 was heated at 300° C./h to a temperature of 770° C. in a sealed tubular furnace under an argon atmosphere and left at this temperature for 12 hours. Then the argon was displaced by a powerful stream of air and the temperature increased to 815° C. This temperature was maintained for 36 hours while a gentle stream of air was blown through. Finally, the furnace was switched off and the reaction product removed from the furnace at a temperature of less than 200° C.

The X-ray diagram of the reaction product (cf. FIG. 1) shows, in addition to the desired two-layer phase, further phases: the single-layer phase $Bi_2Sr_{(2-x)}Ca_x$-

$CuO_6$, an alkaline earth cuprate $Sr_{(1-y)}Ca_yCuO_2$, an alkaline earth bismuthate $Sr_{(3-z)}Ca_zBi_2O_6$ and copper-(II) oxide.

EXAMPLE 2

(in accordance with the invention)

Example 1 was repeated with the modification that the thoroughly homogenized mixture contained the copper in the form of CuO and $Cu_2O$ in the weight ratio of 1:1.

According to the X-ray diagram of the reaction product (cf. FIG. 2), virtually only the two-layer phase (phase purity: 95%) has been produced.

EXAMPLE 3

(comparison)

A thoroughly homogenized mixture of $Bi_2O_3$, SrO, CaO and CuO in the stoichiometric ratio of 2:2:1:2 was heated at 250° C./h to a temperature of 750° C. in a sealed tubular furnace under a nitrogen atmosphere and left at this temperature for 12 hours. Then the nitrogen was displaced by a powerful stream of air and the temperature increased to 850° C. This temperature was maintained for 36 hours while blowing through a gentle stream of air. Finally, the furnace was switched off and the reaction product was removed from the furnace at a temperature below 200° C.

The X-ray diagram of the reaction product (cf. FIG. 3) shows that a multiphase mixture is present which contains the two-layer phase only in a minor amount.

EXAMPLE 4

(in accordance with the invention)

Example 3 was repeated with the modification that the thoroughly homogenized mixture contained the copper in the form of CuO and $Cu_2O$ in the weight ratio of 1.25:0.75.

According to the X-ray diagram (cf. FIG. 4), the reaction product is composed virtually only of the phase-pure two-layer compound.

EXAMPLE 5

(in accordance with the invention)

Example 4 was repeated with the modification that a stream of pure oxygen (1 bar) instead of the gentle stream of air was blown through the tubular furnace for 24 hours at 850° C.

Figure 4:
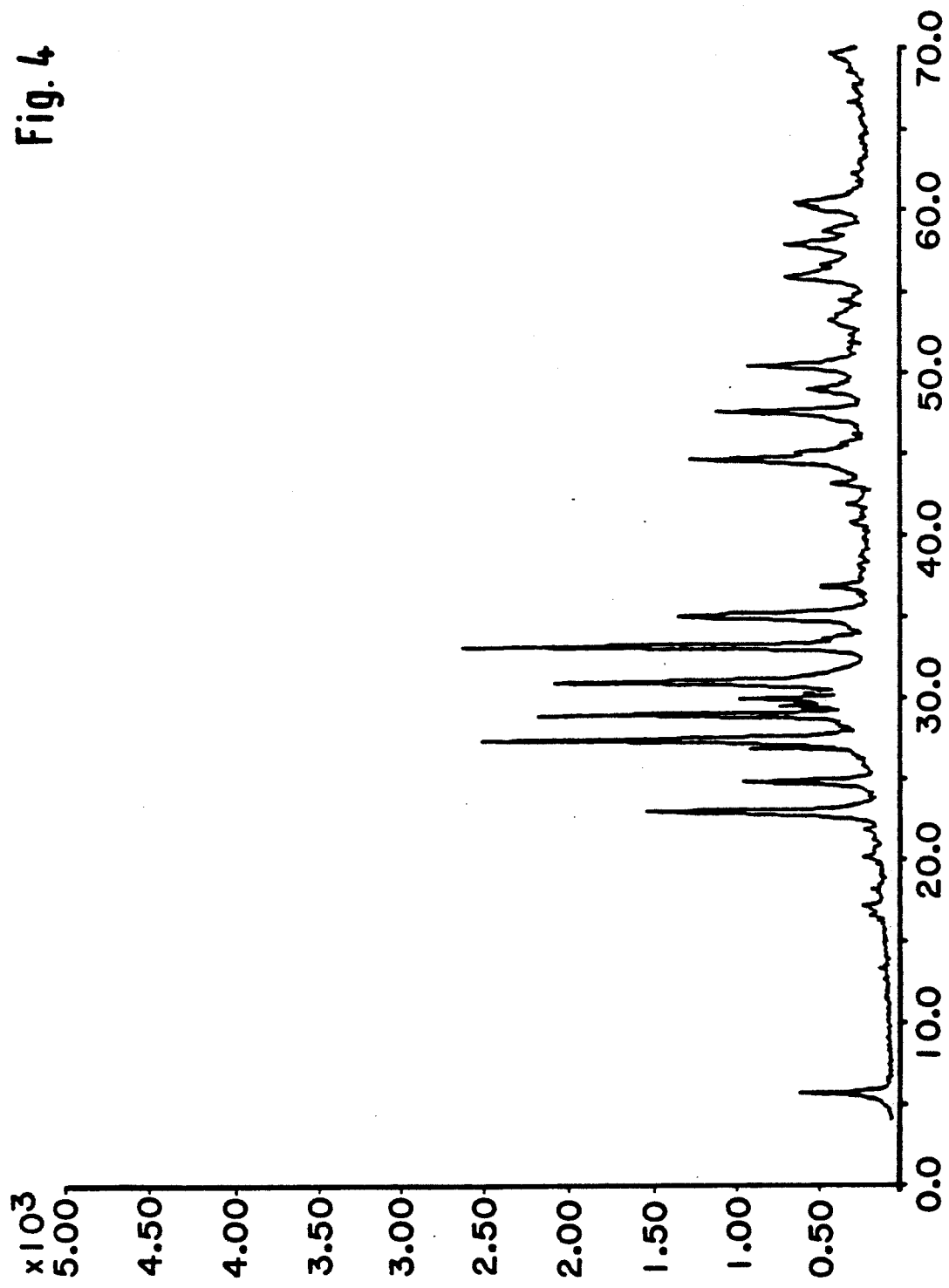

The X-ray diagram of the reaction product corresponds to that in accordance with FIG. 4.

EXAMPLE 6

(comparison)

Example 4 was repeated with the modification that the first substep of the reaction is not carried out under a nitrogen atmosphere but in air.

According to the X-ray diagram a multiphase mixture containing a CuO component is produced in this process.

We claim:

1. A process for producing powdered high-temperature superconductors of the composition $Bi_{(2+a)}(Sr_{(1-b)}Ca_{b(3-a)})Cu_{(2+c)}O_{8+x}$, where a is from 0 to 0.3, b is from 0.1 to 0.9 and c is from 0 to 2, and x has a value which depends on the oxidation state of the metals contained, by thoroughly mixing the oxides or carbonates of bismuth, strontium, calcium and copper and heating this mixture, which comprises using the copper compound as a mixture of Copper (I) oxide and copper (II) oxide, wherein the weight ratio of copper in the copper (I) oxide to copper in the copper (II) oxide is (0.25:1.75) to (1.75:0.25); allowing the mixture first to react mutually in an inert gas atmosphere at temperatures from 700° to 800° C. for 0.5 to 36 hours; and subsequently treating the mixture in an oxygen-containing atmosphere at temperatures from 700° to 875° C. for 3 to 60 hours.

2. The process as claimed in claim 1, wherein the weight ratio is (0.5:1.5) to (1.5:0.5).

3. The process as claimed in claim 1, wherein the mixture is allowed to react mutually in an inert gas atmosphere at temperatures from 750° to 780° C.

4. The process as claimed in claim 1, wherein the mixture is allowed to react mutually in an inert gas atmosphere for 12 to 24 hours.

5. The process as claimed in claim 1, wherein argon is used as the inert gas.

6. The process as claimed in claim 1, wherein nitrogen is used as the inert gas.

7. The process as claimed in claim 1, wherein treatment is carried out in an oxygen-containing atmosphere at temperatures from 810° to 860° C.

8. The process as claimed in claim 1, wherein air is used as the oxygen-containing atmosphere.

* * * * *